United States Patent
Enyama et al.

(10) Patent No.: US 9,704,687 B2
(45) Date of Patent: Jul. 11, 2017

(54) CHARGED PARTICLE BEAM APPLICATION DEVICE

(71) Applicant: HITACHI HIGH-TECHNOLOGIES CORPORATION, Minato-ku, Tokyo (JP)

(72) Inventors: Momoyo Enyama, Tokyo (JP); Akira Ikegami, Tokyo (JP); Hideto Dohi, Tokyo (JP); Hideyuki Kazumi, Tokyo (JP); Naomasa Suzuki, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/741,324

(22) Filed: Jun. 16, 2015

(65) Prior Publication Data

US 2015/0364290 A1 Dec. 17, 2015

(30) Foreign Application Priority Data

Jun. 16, 2014 (JP) .................................. 2014-123015

(51) Int. Cl.
*H01J 37/14* (2006.01)
*H01J 37/147* (2006.01)
(Continued)

(52) U.S. Cl.
CPC ........ *H01J 37/1478* (2013.01); *H01J 37/153* (2013.01); *H01J 37/28* (2013.01); *H01J 2237/1534* (2013.01)

(58) Field of Classification Search
CPC .... H01J 37/147; H01J 37/1478; H01J 37/153; H01J 37/26; H01J 37/261; H01J 37/28;
(Continued)

(56) References Cited

U.S. PATENT DOCUMENTS 6,614,026 B1 * 9/2003 Adamec .............. H01J 37/1478
250/396 ML
8,884,245 B2 11/2014 Henstra et al.
(Continued)

FOREIGN PATENT DOCUMENTS

JP 2001-15055 A 1/2001
JP 2007-128893 A 5/2007

*Primary Examiner* — David E Smith
(74) *Attorney, Agent, or Firm* — Miles & Stockbridge P.C.

(57) ABSTRACT

The charged particle beam application device is provided with a charged particle source and an objective lens that converges charged particle beam generated by the charged particle source onto a sample. In this case, the charged particle beam application device is further provided with an aberration generating element installed between the charged particle beam source and the objective lens, a tilt-use deflector installed between the aberration generating element and the objective lens, a deflection aberration control unit for controlling the aberration generating element, a first electromagnetic field superposing multipole installed between the aberration generating element and the objective lens, and an electromagnetic field superposing multipole control unit for controlling the first electromagnetic field superposing multipole. The aberration generating element has such a function that when the charged particle beam is tilted relative to the sample by the tilt-use deflector, a plurality of resulting aberrations are cancelled with one another. Moreover, the first electromagnetic field superposing multipole has a function to change the orbit of a charged particle beam having energy different from that of the main charged particle beam in the charged particle beam.

9 Claims, 10 Drawing Sheets

(51) Int. Cl.
*H01J 37/153* (2006.01)
*H01J 37/28* (2006.01)

(58) Field of Classification Search
CPC ......... H01J 2237/153; H01J 2237/1532; H01J 2237/1534
See application file for complete search history.

(56) References Cited

U.S. PATENT DOCUMENTS

2007/0158567 A1* 7/2007 Nakamura .......... H01J 37/1471
                                                    250/311
2008/0290264 A1* 11/2008 Henstra ................. H01J 37/153
                                                    250/252.1
2014/0151552 A1* 6/2014 Jiang .................... H01J 37/263
                                                    250/307

\* cited by examiner

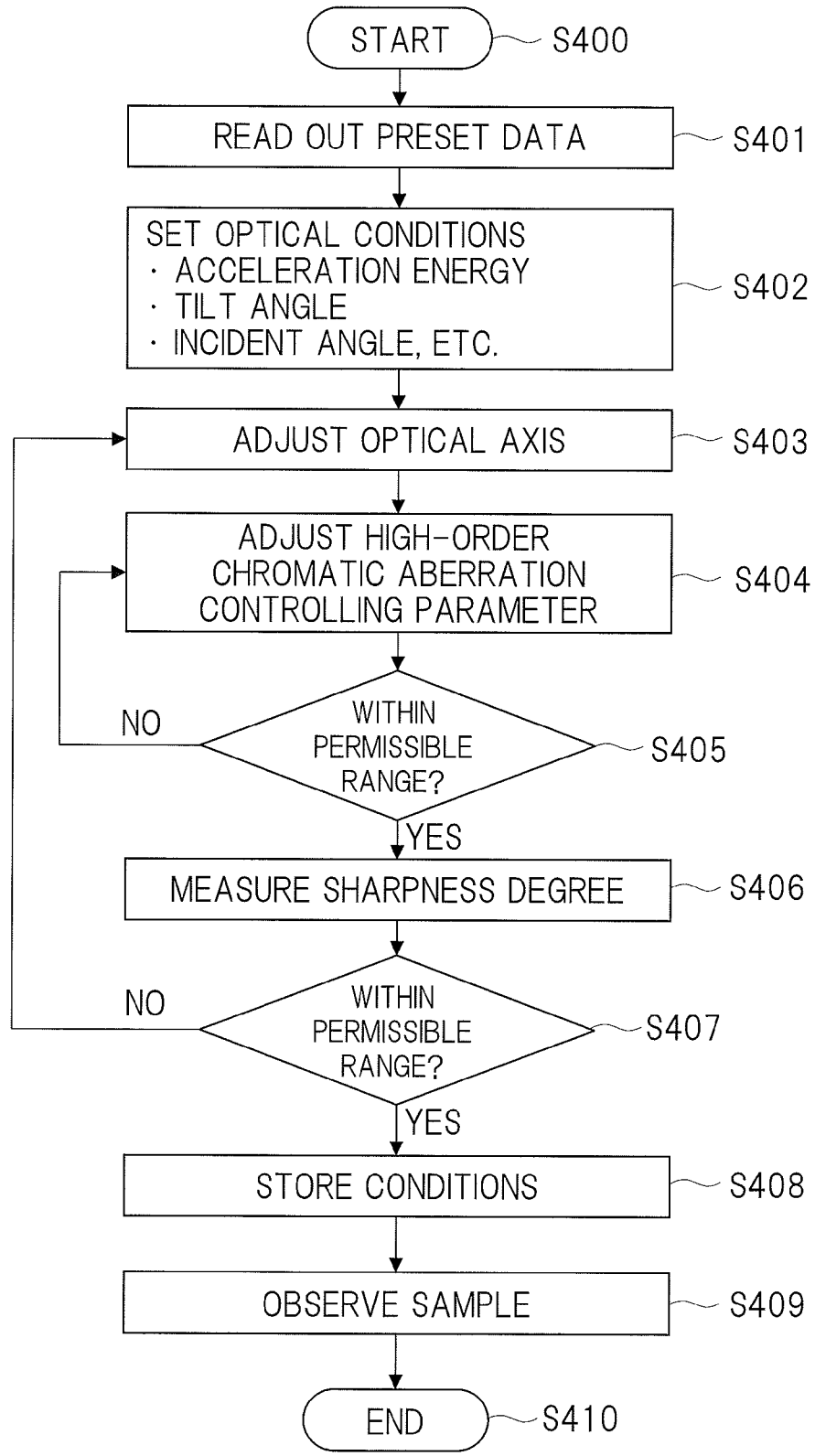

CHARGED PARTICLE BEAM APPLICATION DEVICE

CROSS-REFERENCE TO RELATED APPLICATION

The present application claims priority from Japanese Patent Application No. 2014-123015 filed on Jun. 16, 2014, the content of which is hereby incorporated by reference into this application.

TECHNICAL FIELD OF THE INVENTION

The present invention relates to a charged particle beam application device, and more particularly to such a device for executing inspection, measuring and/or observation processes by utilizing a charged particle beam.

BACKGROUND OF THE INVENTION

As the charged particle beam application device, a charged particle beam length measuring device, a charged particle beam inspection device and the like have been known. The charged particle beam length measuring device and charged particle beam inspection device are used for manufacturing processes of, for example, semiconductors or magnetic discs. In this case, in the charged particle beam length measuring device, a charged particle beam (hereinafter, referred to also as a primary beam), such as an electron beam or an ion beam, is radiated onto a sample, and by acquiring a signal of a secondary charged particle beam (hereinafter, referred to also as a secondary beam) of secondary electrons or the like generated in accordance with the shape or size of a pattern formed on the sample, the shape or dimension of the pattern is measured. Moreover, in the charged particle beam inspection device, based upon the signal of the acquired secondary beam, a check is executed as to whether or not any pattern defect is present. As a specific example of these charged particle beam length measuring device and charged particle beam inspection device, a scanning electron microscope (hereinafter, referred to as "SEM") has been conventionally known.

In recent years, in a semiconductor on which the length measurements or inspections are executed by using the SEM, high miniaturization of the semiconductor device has been developed and the miniaturization is coming to the limitation. For this reason, in order to further achieve high integration of the semiconductor device, a three dimensional configuration of the device has been developed in place of the miniaturization thereof.

In the semiconductor device having the three dimensional configuration, in order to execute inspections and/or length measurements, it is necessary to acquire information in the height direction of a sample in addition to observations in the planar directions, that is, observations of the planar shape or the dimensions of the sample. By radiating a tilted primary beam onto a sample, as well as by acquiring a signal of the secondary beam generated by the radiation of the beam, it is possible to also obtain the information of the height direction in accordance with the three dimensional configuration.

As the configuration for radiating the tilted primary beam to the sample, it is proposed to mechanically tilt a sample base or a sample stage on which a sample is mounted relative to the primary beam. In the general-use SEM, the sample can be cut out as a small piece. Therefore, by mounting the cut-out small piece of the sample on the sample base, the sample base is mechanically tilted, so that a tilted primary beam relative to the sample is radiated onto the sample.

On the other hand, the inspection and/or length measuring operations in the manufacturing process of a semiconductor are executed in a line for manufacturing the semiconductor device. That is, the SEM to be used for inspection and length measuring operations of the semiconductor is used as a process managing tool of the in-line. As a nature referred to as the process managing tool, a wafer on which a large number of semiconductor devices are formed is used as the sample. Therefore, the sample stage for use in mounting the wafer serving as the sample has a physically large size. When such a large sample stage is mechanically tilted, the action distance from the objective lens to the sample in the SEM inevitably becomes long, with the result that the resolution is lowered. For this reason, it is desired to execute an observation in a beam tilt system in which a defector is installed on the SEM and the electron beam is tilted electrically by the deflector. Although this system is advantageous in the period of time required for the tilting process and the reproducibility, a problem is raised in that deflection chromatic aberration and deflection comma aberration are increased because the electron beam passes through the inside of the objective lens at a position greatly apart from the optical axis.

A technique for cancelling the deflection chromatic aberration is described in, for example, Japanese Patent Application Laid-Open No. 2001-15055 (Patent Document 1). In Patent Document 1, a technique for cancelling the deflection chromatic aberration by installing a Wien filter is disclosed. Moreover, Japanese Patent Application Laid-Open No. 2007-128893 (Patent Document 2) has a description in accordance with a chromatic aberration corrector in which a transmission optical part for use in crossing charged particle beams (beams) having different energies in the vicinity of a lens main surface is indicated.

SUMMARY OF THE INVENTION

The deflection chromatic aberration to be cancelled at the time of a beam tilting process is represented by a polynomial expression relative to a tilt angle, that is, an amount of deflection. In this case, the polynomial expression has a linear term and a quadratic or more term relative to the amount of deflection. In the beam tilt system, in the case when the beam tilt angle is comparatively small, that is, in a beam tilt with a small angle, the value of the quadratic or more term in the polynomial expression is smaller than the value of the linear term, so that the influence relative to the aberration to be cancelled is small. However, in the case when the beam tilt angle is large, that is, in a beam tilt with a large angle of 10 degrees or more, the value of the quadratic or more term relative to the amount of deflection becomes large, with the result that the influence relative to the aberration to be cancelled becomes greater.

In the technique disclosed in Patent Document 1, only the aberrations of two kinds represented by the linear term relative to the amount of deflection, that is, the deflection chromatic aberration and the deflection comma aberration, serve as the targets. That is, in an attempt to realize a beam tilt with a large angle, no influences from high-order chromatic aberrations that appear as a quadratic or more term relative to the amount of deflection are taken into consideration. In the case when a deflection chromatic aberration to be cancelled is generated based upon a main charged particle beam of a charged particle beam, the high-order chromatic aberration is considered to be generated by the fact that an orbit of a charged particle beam having an electron beam energy different from the energy (acceleration) of the main charged particle beam is changed to cause a great difference in distances apart from the axis at the inside of the objective lens.

In Patent Document 2, the transmission optical part also reacts with the orbit of the main beam having an average energy. For this reason, it is difficult to simultaneously make both the linear term and the quadratic or more term smaller in the polynomial expression.

In both of Patent Document 1 and Patent Document 2, in an attempt to realize a large angle beam tilt, no consideration is given so as to reduce the deflection chromatic aberration, with the result that a problem still remains in executing a tilted observation with high resolution.

An object of the present invention is to provide a charged particle beam application device capable of executing a tilted observation with high resolution.

The above and other objects and novel characteristics of the present invention will be apparent from the description of the present specification and the accompanying drawings.

The following is a brief description of an outline of the typical invention disclosed in the present application.

That is, a charged particle beam application device is provided with a charged particle source and an objective lens that converges a charged particle beam generated by the charged particle source onto a sample. In this case, the charged particle beam application device is further provided with an aberration generating element installed between the charged particle beam source and the objective lens, a tilt-use deflector installed between the aberration generating element and the objective lens, a deflection aberration control unit for controlling the aberration generating element, a first electromagnetic field superposing multipole installed between the aberration generating element and the objective lens, and an electromagnetic field superposing multipole control unit for controlling the first electromagnetic field superposing multipole.

The aberration generating element has such a function that when the charged particle beam is tilted relative to the sample by the tilt-use deflector, a plurality of resulting aberrations are cancelled (eliminated) with one another. Moreover, the first electromagnetic field superposing multipole has a function to change the orbit of a charged particle beam having energy different from that of the main charged particle beam in the charged particle beam. Thus, the deflection chromatic aberration and/or the deflection comma aberration that appear in the linear term relative to the amount of defection in the polynomial expression is corrected by the aberration generating element, and the high-order chromatic aberration that appear in the quadratic or more term relative to the amount of deflection is suppressed by the first electromagnetic superposing multipole. As a result, in an observation process (including inspection and/or length measuring operations), by using a large angle beam tilt with an enlarged tilt angle, it becomes possible to reduce the deflection chromatic aberration and consequently to execute an observation with high resolution. Moreover, since the amount of convergence of the charged particle beam is improved, it is possible to provide a charged particle beam application device with high sensitivity and high efficiency.

In accordance with the embodiment, it is possible to provide a charged particle beam application device capable of executing a tilted observation with high resolution.

BRIEF DESCRIPTIONS OF THE DRAWINGS

FIG. 4 is a flow chart showing operations of a tilted observation in accordance with the first embodiment;

DESCRIPTIONS OF THE PREFERRED EMBODIMENTS

Figure 1:
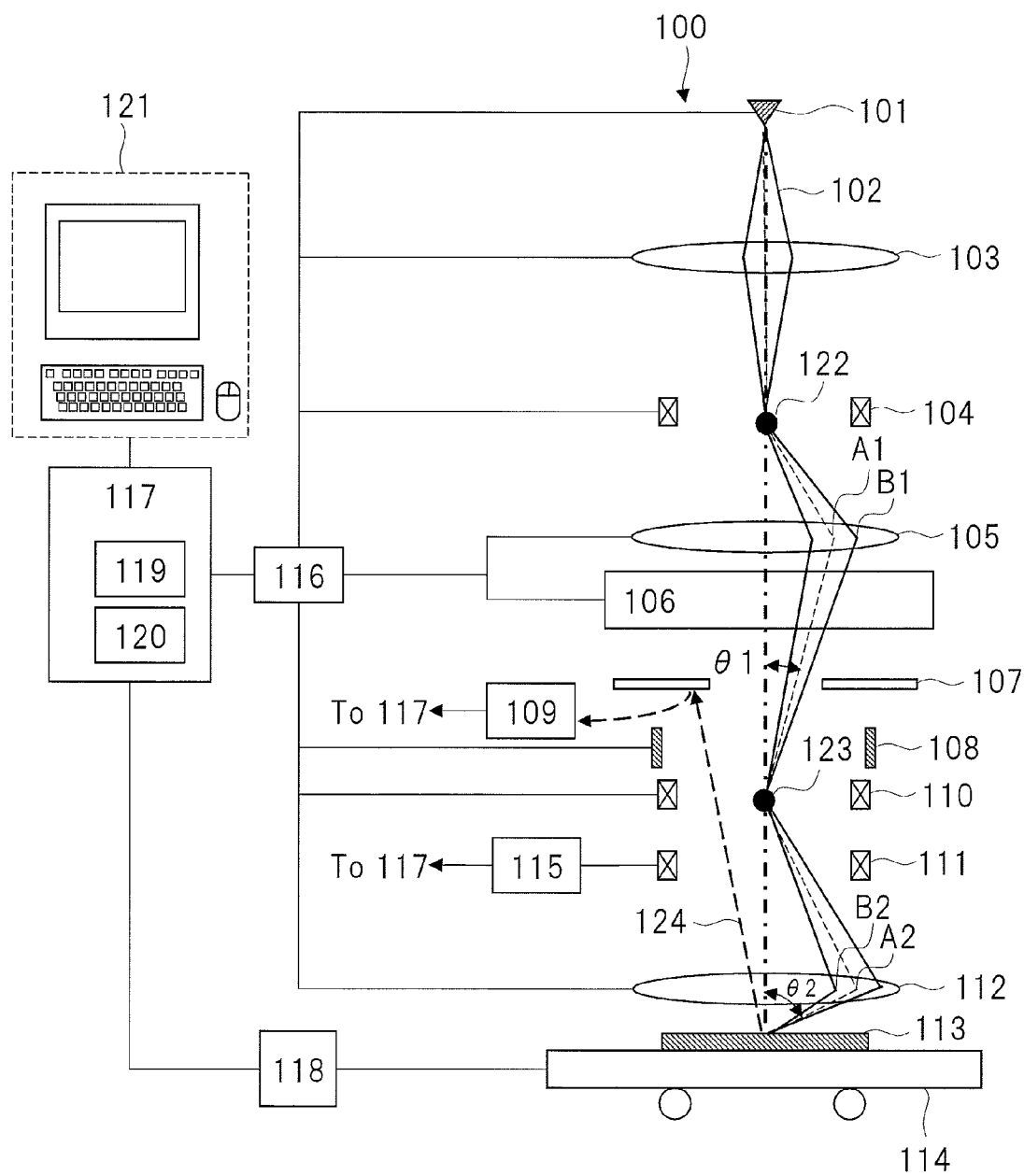
FIG. 1 is a block diagram showing a configuration of an electron beam observation device in accordance with a first embodiment.

Referring to the figures, the following description will explain embodiments of the present invention in detail. Additionally, in all the figures for explaining the embodiments, in principle, the same members are indicated by the same reference numerals, and the repeated explanations will be omitted. In the following description, the charged particle beam application device will be explained by exemplifying an electron beam observation device that observes a sample by using an electron beam. However, the charged particle beam application device is not limited to the observation device, but includes an inspection device or a length measuring device for executing an inspecting operation or a length measuring operation. Moreover, explanations will be given by exemplifying an electron beam as a charged particle beam; however, an ion beam may be used as the charged particle beam. Furthermore, the present invention may also be applicable not only to an observation device, an inspection device and a length measuring device, but also to a measuring device or an electron microscope.

First Embodiment

FIG. 1 is a block diagram showing a configuration of an electron beam observation device 100 in accordance with the first embodiment. When generally classified, the electron beam observation device 100 is provided with an electron optical system and a control system.

In FIG. 1, although not particularly limited, the electron optical system is provided with an electron source (charged particle source) 101, a condenser lens 103, an aberration generating deflector 104, an aberration generating lens 105, a high-order chromatic aberration controlling electromagnetic multipole 106, a reflection plate 107, a beam separator 108, a detector 109, a beam tilt-use deflector 110, a scan deflection-use deflector 111 and an objective lens 112. The electron source 101 generates an electron beam (charged particle beam) 102, and in FIG. 1, radiates the beam in the downward direction (downstream direction). In FIG. 1, a one-dot chain line indicates an optical axis of the electron beam 102 in the case when the electron beam 102 is not tilted.

In a direction of the electron beam 102 radiated from the electron source 101, that is, toward a downstream direction of the electron source 101, along the optical axis of the electron beam 102, a condenser lens 103, an aberration generating deflector 104, an aberration generating lens 105, a high-order chromatic aberration controlling electromagnetic multipole 106, a reflection plate 107, a beam separator 108, a beam tilt-use deflector 110, a scan deflection-use deflector 111 and an objective lens 112 are disposed in this order. The detector 109 is disposed at a position separated from the optical axis of the electron beam 102 so as to detect the electron beam reflected by the reflection plate 107. The electron optical system shown in FIG. 1 illustrates only the portion required for explaining this embodiment, and although not shown in this figure, it should be understood that the electron optical system also includes a current limiting diaphragm, a center axis (optical axis) adjusting aligner for a primary beam and an aberration compensator, etc.

With respect to the above-mentioned condenser lens 103, the aberration generating lens 105 and the objective lens 112, explanations thereof will be given by exemplifying an electromagnetic lens whose focus is controlled by an excitation current. Moreover, the explanations are also given by exemplifying a configuration in which each of them is formed by an electromagnetic lens with one stage; however, each of them may be formed by electromagnetic lenses with a plurality of stages. Furthermore, each of them may be formed by using a so-called electrostatic lens with one stage or with a plurality of stages, or may be formed by combining an electromagnetic lens and an electrostatic lens.

In FIG. 1, reference numeral 113 represents a sample to be observed. In this embodiment, a semiconductor wafer corresponds to the sample 113. The sample 113 is mounted on a sample stage 114. The sample stage 114 is moved with the sample 113 mounted thereon by rotating a rotary member illustrated on the lower surface of the sample stage 114 in FIG. 1. Between the semiconductor wafer corresponding to the sample 113 and the sample stage 114, a wafer holder is interposed, although not shown in the figure. This wafer holder and the semiconductor wafer are electrically conducted to each other, and a predetermined voltage is supplied to the wafer holder. Thus, a predetermined voltage is applied to the semiconductor wafer (sample 113).

The above-mentioned scan deflection-use deflector 111 is connected to a scanning signal generation device 115, and the scanning signal generation device 115 is connected to the system control unit 117. Moreover, each of the above-mentioned electron source 101, the condenser lens 103, the aberration generating deflector 104, the aberration generating lens 105, the high-order chromatic aberration controlling electromagnetic multipole 106, the beam separator 108, the beam tilt-use deflector 110 and the objective lens 112 is connected to an optical system control circuit 116, and the optical system control circuit 116 is connected to the system control unit 117. The sample stage 114 is connected to a stage control device 118, and the stage control device 118 and the detector 109 are connected to the system control unit 117 in the same manner.

The system control unit 117 is functionally provided with a storage unit 119 and an operation unit 120. This system control unit 117 is connected to an input/output unit 121. The input/output unit 121 is provided with an input means for inputting information and/or instructions to the system control unit 117 and a display means for outputting information from the system control unit 117.

Although not particularly limited, a control system of the electron beam observation device 100 includes the scanning signal generation device 115, the optical system control circuit 116, the system control unit 117, the stage control device 118 and the input/output unit 121. It is needless to say that constituent elements other than these control system and circuit system are disposed inside a vacuum container (not shown) and operated by vacuum-exhausting the inside of the vacuum container. Moreover, it is needless to say that a wafer transporting system (not shown) for mounting a wafer from the outside of the vacuum container onto the sample stage 114 is also provided. Additionally, for convenience of explanation, FIG. 1 shows the wafer serving as the sample 113; however, it is needless to say that the sample 113 is not a constituent element of the electron beam observation device 100.

The system control unit 117 is more specifically explained as follows: the storage unit 119 serving as a storage device is used for storing programs and various pieces of information. Moreover, the operation unit 120 is an operation device included in a central processing unit (not shown in the figure). This central processing unit executes programs or the like stored in the storage unit 119, while using the operation unit 120. By allowing the central processing unit to execute programs or the like, an image processing process related to observation (defect inspection or dimension measurements) or control processes of the scanning signal generation device 115, the stage control device 118, the optical system control circuit 116 or the like are executed. That is, through the scanning signal generation device 115, the stage control device 118, the optical system control circuit 116 and the like, control processes for elements included in the electron optical system are executed by the system control unit 117. In the present specification, elements including the system control unit 117, the input/output unit 121, the scanning signal generation device 115, the stage control device 118, the optical system control circuit 116 and the like are referred to as a control unit in some cases.

In FIG. 1, a keyboard and a mouse are illustrated as the input means of the input/output unit 121, and a liquid crystal display device is illustrated as the display means. However, the input/output unit 121 is not intended to be limited by these devices, and for example, the respective configurations of the input means and the display means (output unit) may be different from the configurations shown in FIG. 1, or by utilizing a touch panel or the like, an input/output means integrally including the input means and the display means may be formed.

Next, the following description will explain operations in the case when an observation (tilted observation) in a tilted state is executed on the sample 113. First, the electron beam 102 is generated by the electron source 101. The electron beam 102 discharged from the electron source 101 is subjected to a converging action from the condenser lens 103, so that an electron source image (a point where the beam diameter is minimized) 122 is formed on the same position as a position formed by the aberration generating deflector 104.

Although not shown in the figure, a current limiting diaphragm is installed between the electron source 101 and the electron source image 122. By using the current limiting diaphragm, the electron beam 102 having a desired current range is allowed to pass through this diaphragm. When operation conditions are altered by controlling the emission current of the electron source 101 and/or controlling the excitation current of the condenser lens 103, the current amount of the electron beam 102 to pass through the current limitation diaphragm can be adjusted to a desired value. Moreover, although not shown in the figure, an aligner for correcting the optical axis of the electron beam 102 is disposed between the electron source 101 and the condenser lens 103. In the case when a center axis of the electron beam 102 deviates from a center axis of the current limiting diaphragm or the electron optical system, a correcting process is executed by the aligner so as to make the center axes coincident with each other.

After the electron source image 122 has been formed, the electron beam 102 is subjected to a deflection by the aberration generating deflector 104 and deflected. By this deflection, the electron beam 102 is made to pass through a position spaced apart from the center axis within the aberration generating lens 105, that is, in a state separated from the axis. Moreover, the electron beam 102 that has passed through the aberration generating lens 105 is allowed to pass through a high-order chromatic aberration controlling electromagnetic multipole 106, so that an electron source image 123 is formed at the same position as that of a beam tilt-use deflector 110. In this case, since the electron source image 122 is formed on the same position as that of the aberration generating deflector 104, the electron source image 123 is also formed on the optical axis.

The high-order chromatic aberration controlling electromagnetic multipole 106 is controlled in such a manner that of the electron beam 102, forces derived from the magnetic field and from the electric field exerted on an electron beam (hereinafter, referred to also as a main electron beam) having an average value of an electron beam energy are cancelled (eliminated) with each other by the optical system control circuit 116. Thus, of the electron beam 102, an orbit of the main electron beam is not influenced by the action of a force derived from the high-order chromatic aberration controlling electromagnetic multipole 106. In other words, when the electron beam 102 passes through the high-order chromatic aberration controlling electromagnetic multipole 106, no orbit change occurs in the main electron beam of the electron beam 102.

After the formation of the electron source image 123, the electron beam 102 is deflected by the beam tilt-use deflector 110. With this arrangement, the electron beam 102 passes through the inside of the objective lens 112 while being separated from its axis. At this time, the electron beam 102 is subjected to a converging action of the objective lens 112 and reaches the sample 113. Since the electron beam 102 receives the deflecting action by the beam tilt-use deflector 111, it is tilted by θ2 relative to the optical axis (one dot chain line) of the electron beam 102 on the sample 113.

The scan deflection-use deflector 111 is controlled by the scanning signal generation device 115 so as to allow the electron beam 102 that has reached the sample 113 in a tilted manner to scan a predetermined region of the sample 113. The electron beam 102 that has reached the surface of the sample 113 mutually reacts with substances located near the surface of the sample 113. Thus, secondary generated electrons, such as reflected electrons, secondary electrons or Auger electrons, are generated from the sample 113 to form signals to be acquired. The case in which electrons generated from the sample 113 form secondary electrons is explained as follows.

That is, secondary electrons 124, which are generated at a position where the electron beam 102 has reached the sample 113, pass through the objective lens 112, and are then deflected by the beam separator 108 having a deflection action to the secondary electrons, and allowed to reach the reflection plate 107. After having collided with the reflection plate 107 and having been reflected therefrom, the secondary electrons reach the detector 109 to be detected. The secondary electrons 124 detected by the detector 109 are supplied to the system control unit 117 as detection signals. In the system control unit 117, a signal processing is executed on the supplied detection signals in synchronism with a scanning signal transmitted from the scanning signal generation device 115 to the scan defection-use deflector 111, and an image is formed based upon the detected signals, so that the resulting image is displayed on the input/output unit 121; thus, an observation of the sample 113 is executed. Additionally, in the present embodiment, the detection of the secondary electrons 124 is, for example, executed in the detector 109 through the beam separator 108 and the reflection plate 107; however, not limited by this, the secondary electrons may be directly introduced to the detector 109, without using the beam separator 108 and the reflection plate 107.

<Cancellation of Deflection Chromatic Aberration and Deflection Comma Aberration>

First, the following description will explain cancellation (elimination) of deflection chromatic aberration and deflection comma aberration. The direction of the deflection by the beam tilt-use defector 110 for use in tilting the electron beam 102 so as to execute a tilted observation, that is, for use in beam tilting, is set in a reversed direction that can cancel the tilt angle (θ1) of the electron beam 102 relative to the optical axis at the time when the electron beam 102 has reached the electron source image 123 by the aberration generating deflector 104.

In the case of using this arrangement, of the electron beam 102, when a center light ray (indicated by a broken line in FIG. 1) and a light ray (indicated by an outside solid line in FIG. 1) in which an open angle is taken into consideration are tracked, the light ray in which the open angle is taken into consideration passes through an outside position (B1 in FIG. 1) relative to the passing position (A1 in FIG. 1) of the center light ray within the aberration generating lens 105. As a result, the aberration generated within the aberration generating lens 105 becomes smaller in the center light ray in comparison with the light ray (solid line) in which the open angle is taken into consideration. In this case, when the direction of the deflection caused by the aberration generating deflector 104 is set in a direction reversed to the direction of the defection by the beam tilt-use deflector 110 as described above, the passing position (indicated by B2 in FIG. 1) of the light ray (indicated by an inside solid line) in which the open angle within the objective lens 112 is taken into consideration is set to an inside position relative to the passing position (indicated by A2 in FIG. 1) of the center light ray (broken line). For this reason, the aberration generated in the objective lens 112 becomes greater in the center light ray (broken line).

Therefore, by controlling the aberration generating deflector 104 and the aberration generating lens 105 to generate aberrations having the same amount as that of the aberration generated in the objective lens 112, the electron beam 102 is allowed to reach the sample while being tilted relative to the optical axis (one dot chain line), with the generated deflection chromatic aberrations being cancelled. Supposing that the spherical aberration coefficients on the image surface definitions of the aberration generating lens 105 and the objective lens 112 are respectively set to Cs1 and Cs2, with the chromatic aberration coefficients being respectively set to Cc1 and Cc2, while the tilt angles of the electron beam 102 relative to the optical axis at the time of the arrivals of the electron source image 123 and the sample 113 being set to θ1 and θ2, in the case when the following formula (1) and formula (2) are satisfied, the deflection chromatic aberration and the deflection comma aberration can be cancelled and corrected.

[Expression 1]

$$\frac{Cs1}{Cs1} = \frac{1}{M^2} \frac{Cs2}{Cc2} \qquad \text{Formula (1)}$$

[Expression 2]

$$\theta 1 = -\frac{1}{M} \frac{Cc2}{Cc1} \frac{\phi 1}{\phi 2} \theta 2 \qquad \text{Formula (2)}$$

In this case, M represents a magnification of the objective lens, and φ1 and φ2 are electron beam energies of the main electron beam when the electron beam 102 has reached the electron source image 123 and the sample 113. In the present embodiment, the aberration generation for use in cancelling the deflection aberration of the objective lens 112 is executed by the deflection of the electron beam by the aberration generating deflector 104; however, this configuration may be realized by installing a diaphragm for selecting an outer axis orbit on an upstream side of the beam tilt-use deflector 110, that is, between the beam tilt-use defector 110 and the electron source 101, because it is only necessary to allow the electron beam to pass through the outside of the axis of the aberration generating lens 105, so as to satisfy the formula (1) and formula (2).

<Suppression of High-Order Chromatic Aberration>

Next, referring to FIGS. 2A to 2D, the following description will explain suppression of a high-order chromatic aberration by the use of the high-order chromatic aberration controlling multipole 106. FIGS. 2A to 2D are schematic views showing a configuration of a beam-tilt electron optical system. In FIGS. 2A to 2D, members that are the same as those of FIG. 1 are indicated by the same reference numerals. Moreover, for convenience of explanation, among those elements included in the electron optical system shown in FIG. 1, those except for the aberration generating lens 105, the objective lens 112 and the high-order chromatic aberration controlling electromagnetic multipole 106 are omitted.

Figure 2A:
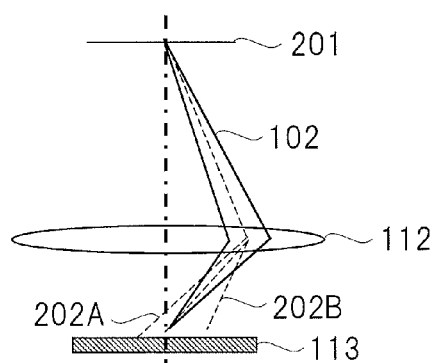
FIG. 2A is a schematic view showing a configuration of a beam-tilt electron optical system in accordance with the first embodiment.

First, FIG. 2A shows a configuration in which the electron beam 102 is tilted only in the objective lens 112 without installing the aberration generating lens 105. In this case, the electron beam 102 proceeds into the objective lens 112 in a tilted state from an object side surface 201 of the objective lens 112, and is subjected to a converging action by the objective lens 112 to reach the sample 113.

Here, the following description will explain the electron beam 102. The electron beam 102 includes a main electron beam having an average electron beam energy and other electron beams having electron beam energies different from that of the main electron beam. The electron beam having an electron beam energy lower than that of the main electron beam is defined as a low speed electron beam 202A in this case, and an electron beam having an electron beam energy higher than that of the main electron beam is defined as a high speed electron beam 202B. In FIGS. 2A to 2D, an electron beam including the main electron beam, the low speed electron beam 202A and the high speed electron beam 202B is indicated by reference numeral 102.

Figure 2B:
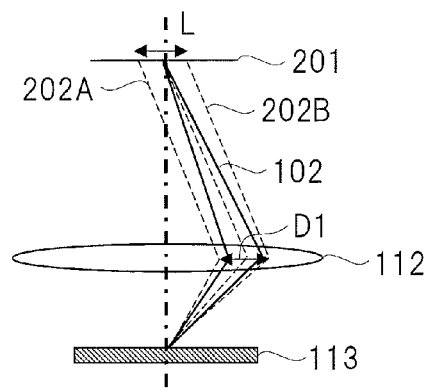
FIG. 2B is a schematic view showing a configuration of the beam-tilt electron optical system in accordance with the first embodiment.

The main electron beam, the low speed electron beam 202A and the high speed electron beam 202B pass through the same orbit without being influenced by an aberration until they have been made incident on the objective lens 112. However, since their electron beam energies are mutually different, they are subjected to aberration after having been made incident on the objective lens 112, and reach different positions on the sample 113. These positional deviations cause deflection chromatic aberrations. In order to correct these deflection chromatic aberrations, as shown in FIG. 2(B), electron beams having different energies can be emitted with a deviated state by a distance L determined by the chromatic aberration of the objective lens 112 so as to cancel the influences of the chromatic aberration by the objective lens 112 on the object side surface 201 of the object lens 112. In other words, in the case of the low speed electron beam 202A that is more strongly influenced by the converging action of the objective lens 112 in comparison with the high speed electron beam 202B, the electron beam can be emitted from the inner side (on the left side relative to the optical axis in FIG. 2) than the main electron beam on the object side surface 201 of the objective lens 112. On the other hand, in the case of the high speed electron beam 202B that is hardly influenced by the converging action of the objective lens 112, the electron beam can be emitted from the outer side (on the right side relative to the optical axis in FIG. 2) than the main electron beam. At this time, a distance of passing positions between the low speed electron beam 202A and the high speed electron beam 202B within the objective lens 112 is defined as D1.

On the object side surface 201 of the objective lens 112, in order to bring the positions from which electron beams having different energies are emitted into a state as shown in FIG. 2B, by using the lens on the upstream side closer to the electron source 101 rather than the objective lens 112, that is, by the aberration generating lens 105, the state indicated by FIG. 2B can be formed, so that the deflection chromatic aberration can be cancelled; thus, this state is mathematized into the above-mentioned formula (2).

Figure 2C:
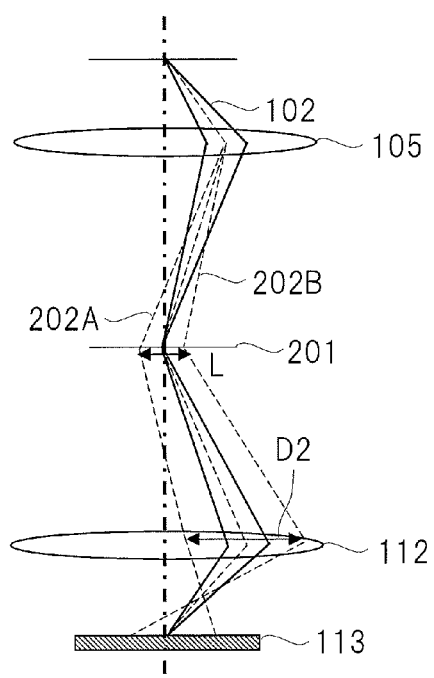
FIG. 2C is a schematic view showing a configuration of the beam-tilt electron optical system in accordance with the first embodiment.

FIG. 2C indicates a configuration in which in order to allow electron beams having different electron beam energies to reach the object side surface 201 of the objective lens 112 with a distance L spaced apart from each other, the orbits of the electron beams 202A and 202B having energies different from that of the main electron beam are controlled within the aberration generating lens 105. With this configuration, in FIG. 2C, on the object side surface 201 of the objective lens 112, the distance of orbits between the low speed electron beam 202A and the high speed electron beam 202B is set to L in the same manner as in FIG. 2B, which corresponds to the condition for cancelling the deflection chromatic aberration.

However, as shown in FIG. 2C, a distance D2 of orbits between the low speed electron beam 202A and the high speed electron beam 202B within the objective lens 112 forms a greatly expanded state in comparison with the distance D1 explained in FIG. 2B. For this reason, a high-order chromatic aberration is generated, with the result that the low speed electron beam 202A and the high speed electron beam 202B having different electron beam energies are not allowed to reach the same position on the sample 113. That is, in the case when a large angle of 10 degrees or more is selected as the tilt angle θ2 on the sample 113, even when a controlling process is executed so as to satisfy formulas (1) and (2), it is not possible to execute an observation with high resolution because of the occurrence of a high-order chromatic aberration. Additionally, in FIG. 2C, on the object side surface 201 of the objective lens 112, the deflection direction of the electron beam 102 is reversed by the beam tilt-use deflector 110 (FIG. 1). For this reason, on the object side surface 201 of the objective lens 112, the direction of the electron beam 102 including the low speed electron beam 202A and the high speed electron beam 202B is deflected as indicated by FIG. 2C. In the case when the deflection direction is not changed by the beam tilt-use deflector 110, the low speed electron beam 202A and the high speed electron beam 202B are emitted in a folding fan manner from the aberration generating lens 105 toward the downstream side.

Figure 2D:
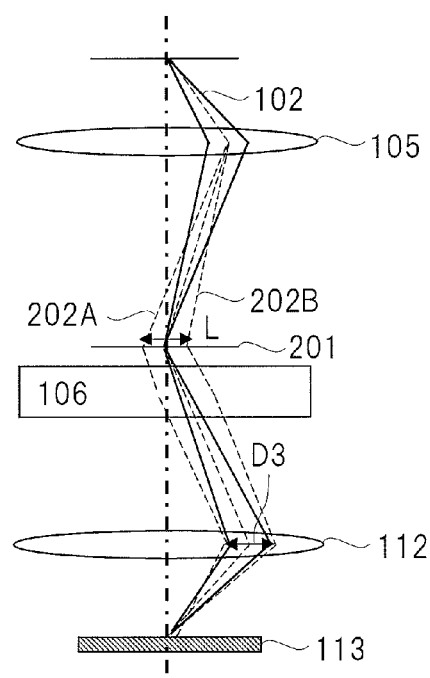
FIG. 2D is a schematic view showing a configuration of the beam-tilt electron optical system in accordance with the first embodiment.

In order to solve this problem, in the present embodiment, the high-order chromatic aberration controlling electromagnetic multipole 106 is installed. A configuration of an electron optical system using the high-order chromatic aberration controlling electromagnetic multipole 106 is shown in FIG. 2D. As shown in FIG. 2D, the high-order chromatic aberration controlling electromagnetic multipole 106 is installed between the objective lens 112 and the aberration generating lens 105. The high-order chromatic aberration controlling electromagnetic multipole 106 is controlled so as to deflect the respective orbits of the low speed electron beam 202A and the high speed electron beam 202B having electron beam energies different from that of the main electron beam, without exerting any action onto the main electron beam contained in the electron beam 102. That is, within the objective lens 112, a distance of orbits between the low speed electron beam 202A and the high speed electron beam 202B is controlled by the optical system control circuit 116 so as to be a distance D3 shorter than the distance D2 shown in FIG. 2C. Thus, in addition to cancellation between the deflection chromatic aberration and the deflection comma aberration, the high-order chromatic aberration can be suppressed.

Additionally, strictly speaking, the orbits of the electron beams having different energies deflected by the high-order chromatic aberration controlling electromagnetic multipole 106 shown in the present embodiment are not coincident with the orbits at the time of the deflection chromatic aberration correction shown in FIG. 2B; therefore, the amount of the deflected chromatic aberration generated by the aberration generating deflector is slightly fluctuated, but no problem is raised in practical use.

<Principle of High-Order Chromatic Aberration Controlling Electromagnetic Multipole>

Figure 3A:
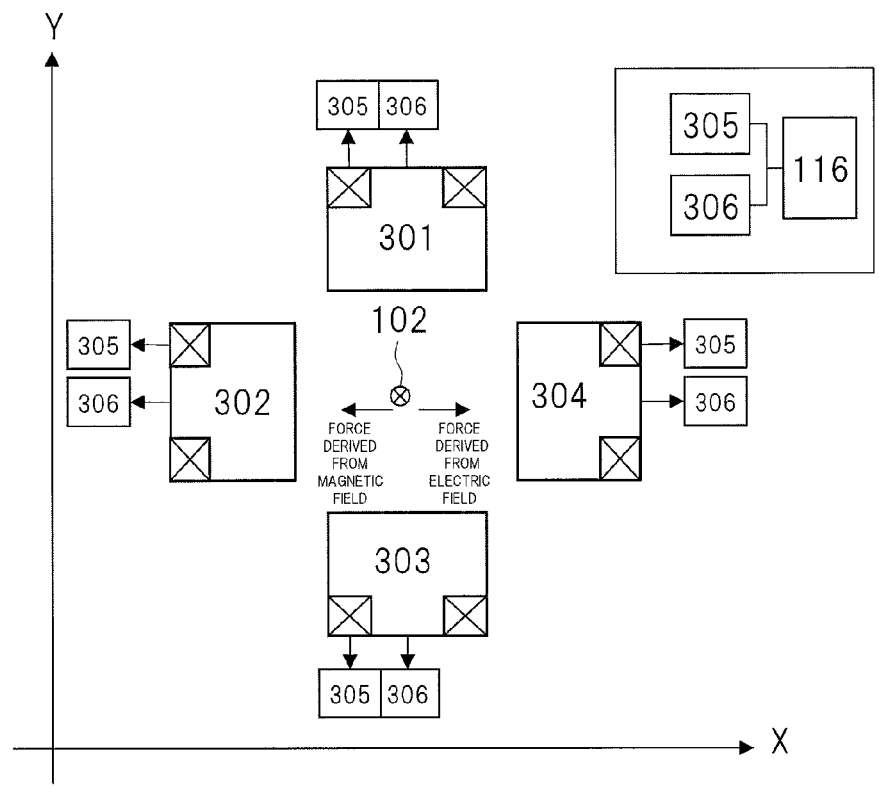
FIG. 3A is a schematic view showing a configuration of a high-order chromatic aberration controlling electromagnetic multipole in accordance with the first embodiment.
Figure 3B:
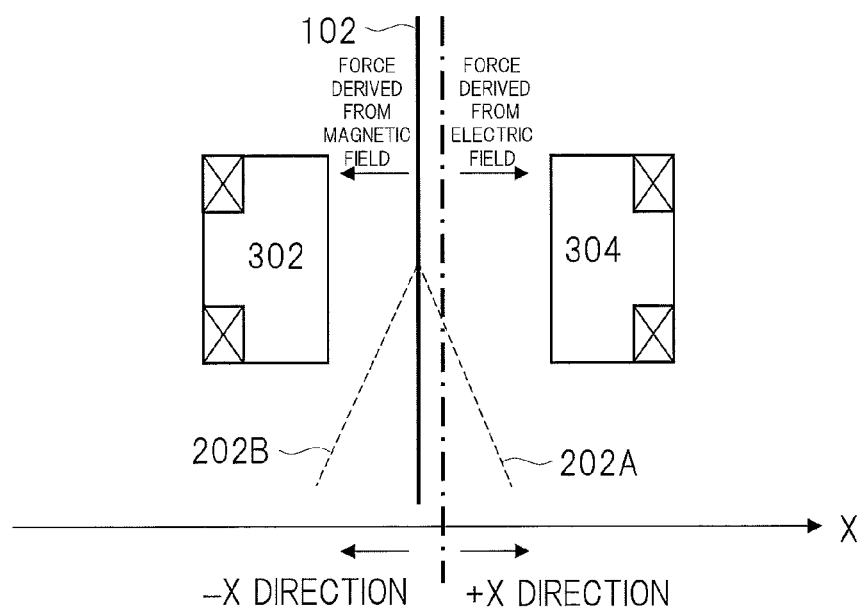
FIG. 3B is a schematic view showing a configuration of the high-order chromatic aberration controlling electromagnetic multipole in accordance with the first embodiment.

The following description will explain the principle of the controlling method of the high-order chromatic aberration controlling electromagnetic multipole 106, which prevents the orbits of electron beams (low speed electron beam 202A and high speed electron beam 202B) having different electron beam energies from expanding within the objective lens 112, without causing any action to the main electron beam contained in the electron beam 102. In the present embodiment, the high-order chromatic aberration controlling electromagnetic multipole 106 is an electromagnetic field superimposing dipole. FIGS. 3A and 3B are schematic views showing a configuration of the high-order chromatic aberration controlling electromagnetic multipole 106.

FIG. 3A shows a plane shape of the high-order chromatic aberration controlling electromagnetic multipole 106 that is projected in a direction perpendicular to the optical axis. Moreover, FIG. 3B shows a cross-sectional shape obtained when the high-order chromatic aberration controlling electromagnetic multipole 106 is viewed along the optical axis. Additionally, in FIG. 3B, the X direction is coincident with the X direction in FIG. 3A.

In FIGS. 3A and 3B, each of reference numerals 301 to 304 represents the electromagnetic poles, and the high-order chromatic aberration controlling electromagnetic multipole 106 shown in FIGS. 3A and 3B is provided with four electromagnetic poles 301 to 304. Coils are wound around each of the four electromagnetic poles 301 to 304, and each coil is connected to the optical system control circuit 116 through the corresponding current supply system 305. By an excitation current supplied from the current supply system 305 to each coil, the magnetic field generated in each of the electromagnetic poles 301 to 304 is controlled. Moreover, each of the electromagnetic poles 301 to 304 is also connected to a voltage supply system 306. In the same manner as in the current supply system 305, the voltage supply system 306 is also controlled by the optical system control circuit 116, so that electric fields formed by the respective electromagnetic poles 301 to 304 are controlled. That is, as shown on the upper right side of FIG. 3A, the current supply system 305 and the voltage supply system 306 of each of the four electromagnetic poles 301 to 304 are connected to the optical system control circuit 116. Thus, the magnetic field and electric field formed by each of the electromagnetic poles are controlled by the optical system control circuit 116.

As shown in FIG. 3, the electron beam 102 passes through a space surrounded by the four electromagnetic poles 301 to 304. A force to be exerted on the electron beam 102 passing through the inside of the high-order chromatic aberration controlling electromagnetic multipole 106 can be indicated by a resultant force derived from forces derived from the electric field and magnetic field generated by the electromagnetic poles 301 to 304. In this case, explanations will be given to a case where a force derived from the electric field in a +X direction and a force derived from the magnetic field in a −X direction, shown in FIG. 3B, are exerted on the electron beam 102, which proceeds from the front side of the drawing paper toward the rear side thereof.

Now suppose that a synthesized electric field in the X direction generated by the electromagnetic poles 301 to 304 is E (vector) and a synthesized magnetic field in the Y direction generated thereby is B (vector). In this case, suppose that the electric field in the Y direction and the magnetic field in the X direction are 0. It has been known that the force derived from the electric field exerted on the electron beam 102 is not dependent on the speed of the electron beam and that the force derived from the magnetic field exerted thereon is in proportion to the speed of the electron beam 102. A force F (vector) to be exerted on the electron beam 102 is represented by formula (3).

[Expression 3]

$$F=eE+evB \quad \text{Formula (3)}$$

In this case, e represents a charged element amount, and v represents the velocity of the electron beam 102. In this case, since the main electron beam is prevented from being subjected to the action by the high-order chromatic aberration controlling electromagnetic multipole 106, in the velocity $v_o$ of the main electron beam, the left side of formula (3) becomes 0, so that the relationship between the synthesized electric field E and the synthesized magnetic field B is determined by formula (4).

[Expression 4]

$$0=eE+ev_oB \quad \text{Formula (4)}$$

Based upon formula (4), depending on the case when the velocity v of the electron beam is greater than $v_o$ and the case when the velocity v of the electron beam is smaller than $v_o$, the plus and minus of the left side of formula (3), that is, the direction of the received force is inverted. As shown in FIG. 3B, in the case of the low speed electron beam 202A, since the force derived from the electric field becomes greater, the deflection is exerted in the +X direction, while in the case of the high speed electron beam 202B, since the force derived from the magnetic field becomes greater, the deflection is exerted in the −X direction. This is coincident with the change in orbits explained in FIG. 2D, so that it becomes possible to positively suppress the high-order chromatic aberration in addition to the cancellation of the deflection chromatic aberration and the deflection comma aberration by using the configuration shown in FIG. 3. In this case, for simplicity of explanation, the explanations have been given on the bipolar field exerted in the X direction; however, the same processes may be executed even in the case when the direction of the bipolar field is rotated in accordance with the tilt direction of the electron beam 102. Moreover, although the number of the electromagnetic multipoles for forming the bipolar field is set to 4, the same effects can be obtained by controlling the applied voltage and coil current to each of the electromagnetic poles so as to form an electromagnetic field superposing bipolar field, even in the case when the number of the electromagnetic multipoles is set to four or more.

<Operation of Tilted Observation>

Figure 5:
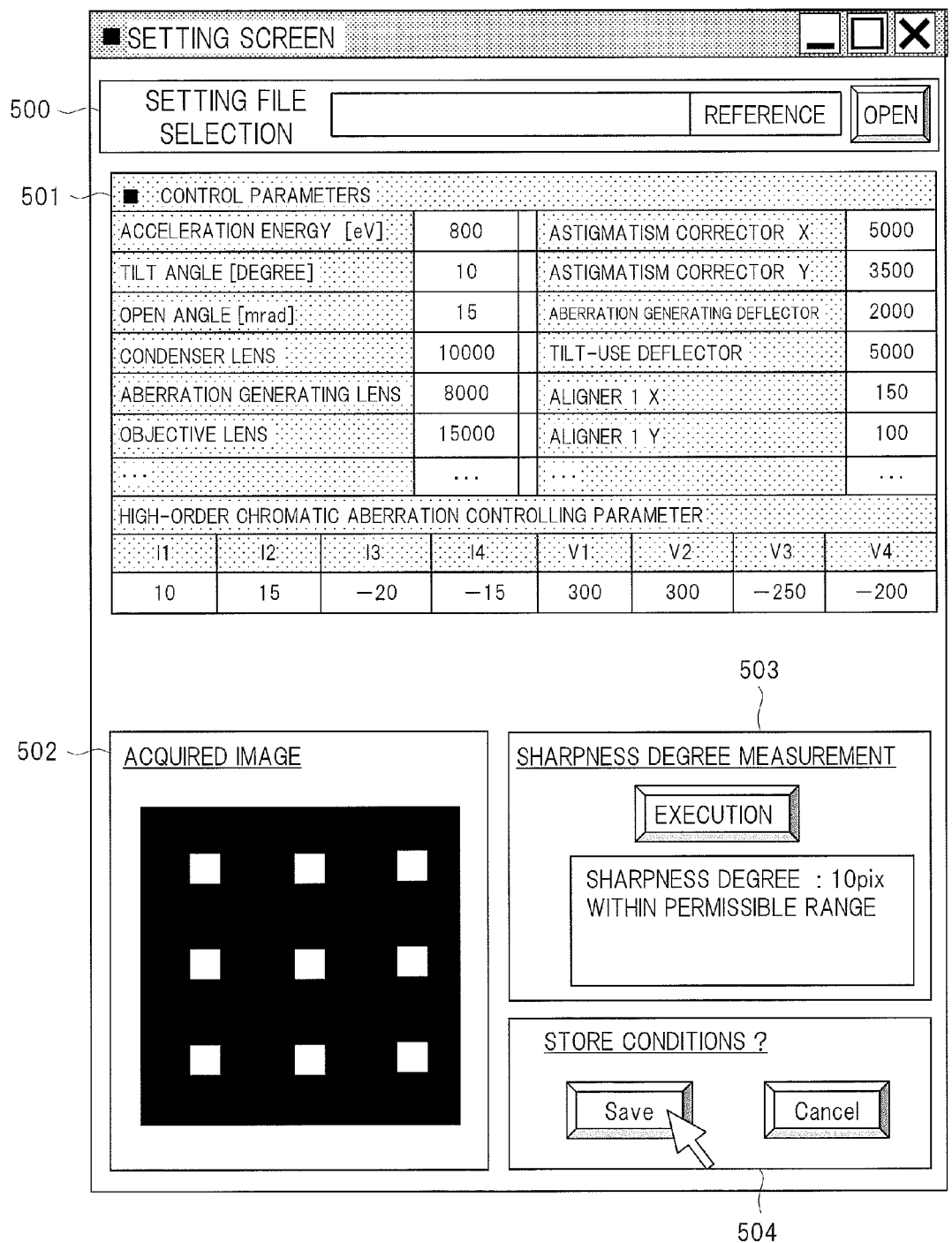
FIG. 5 is an electron beam adjustment setting screen for use in executing the operations of the tilted observation in accordance with the first embodiment.

Next, referring to FIG. 4 and FIG. 5, the following description will explain operations of a tilted observation executed by using the electron beam observation device 100 shown in FIG. 1. FIG. 4 is a flow chart showing operations at the time of executing the tilted observation on the sample 113, which includes a step of adjusting an electron beam and a step of executing the tilted observation. Moreover, FIG. 5 shows an example of an image displayed on the display means in the input/output unit 121 shown in FIG. 1. In this embodiment, the input/output unit 121 has a configuration in which the display means and the input means are integrally formed. That is, an image display is executed on the screen, and an inputting process is also executed by touching a predetermined position of the image.

First, in step S400, an operator operates the input/output unit 121, so that the system control unit 117 is activated so as to start a tilted observation with high resolution. By operating the system control unit 117, the system control unit 117 is allowed to display an image as shown in FIG. 5 on the display means of the input/output unit 121. FIG. 5 shows a setting screen for use in setting conditions or the like of electron beam adjustments. Although not particularly limited, this setting screen is designed to also display an image acquired in an electron beam adjusting step so as to improve convenience of use.

When the setting screen as shown in FIG. 5 is displayed, the operator executes settings of conditions of the electron optical system on the setting screen. First, by operating a "reference" button and an "open" button of a "setting file selection" unit 500 shown in FIG. 5, a desired file is selected. Of course, by directly inputting a file name, as well as operating the "open" button, a desired file may be selected. A plurality of preset data are preliminarily stored in the storage unit 119 of the system control unit 117, and from these preset data, preset data corresponding to a desired file are read out from the storage unit 119. The preset data thus read out are reflected to a "control parameter" unit 501 shown in FIG. 5. Simultaneously with this, a control signal corresponding to the read preset data is generated in the system control unit 117, and supplied to the scanning signal generation device 115, the optical system control circuit 116 or the like.

In accordance with the control signal supplied from the system control unit 117, the scanning signal generation device 115, the optical system control circuit 116 or the like control the condenser lens 103, the aberration generating deflector 104, the aberration generating lens 105, the high-order chromatic aberration controlling electromagnetic multipole 106, the beam separator 108, the beam tilt-use deflector 110, the scan deflecting deflector 111, the objective lens 112 and the like (step S401). The preset data stored in the storage unit 119 may be preliminarily determined so as to match theoretical values, or preliminarily determined values may be used.

Next, the operator inputs electron optical conditions required for a sample observation (in this example, tilted observation), such as an acceleration energy, a tilt angle, an open angle (incident angle) or the like of the electron beam 102, into the "control parameter" unit 501. The system control unit 117 supplies the control signal in accordance with the contents of the inputted optical conditions to the scanning signal generating device 115, the optical system control circuit 116, and the like. By this control signal, the condenser lens 103, the aberration generating deflector 104, the aberration generating lens 105, the high-order chromatic aberration controlling electromagnetic multipole 106, the beam separator 108, the beam tilt-use deflector 110, the scan deflecting deflector 111, the objective lens 112 and the like are set to electron optical conditions in accordance with the contents of the inputted optical conditions (step S402).

In accordance with the electron optical conditions thus set, the electron beam 102 is radiated to the sample 113, so that a tilted observation in the electron beam adjusting step is executed. In this tilted observation, an image formed based upon the data from the detector 109 is displayed on an "acquired image" unit 502 shown in FIG. 5. While observing the image displayed on the "acquired image" unit 502, the operator alters the input value to the "control parameter" unit 501, and executes optical axis adjustments by adjusting set values of an astigmatism corrector, an aligner, the aberration generating lens and the like, by the use of adjusting dials (not shown) provided in the input/output device 121 (step S403).

Next, while confirming the image displayed on the "acquired image" unit 502, the operator adjusts high-order chromatic aberration controlling parameters inside the "control parameter" unit 501 so as to provide a state in which the high-order chromatic aberration is suppressed (step S404). Additionally, in FIG. 5, of the high-order chromatic aberration controlling parameters inside the "control parameter" unit 501, those parameters starting with a letter I correspond to excitation currents that are allowed to flow through coils of the high-order chromatic aberration controlling electromagnetic multipoles, and those parameters starting with a letter V correspond to voltage values to be applied to the high-order chromatic aberration controlling electromagnetic multipoles. That is, by the values set to the parameters starting with the letter I, the excitation currents are determined, and by the values set to the parameters starting with the letter V, the voltage values are determined. The system control unit 117 determines whether or not the respective parameters adjusted (set) in step S404 are included within permissible ranges (step S405), and the step S404 is repeated until they have been included within the predetermined ranges. For example, the system control unit 117 determines whether or not an adjustment exceeding the permissible range of the electron beam observation device 100 is instructed by each of the parameters, and directs the operator so as to set the parameter within the permissible range of the electron beam observation device 100.

Thereafter, if necessary, the operator presses an "execution button" of a "sharpness degree measuring" unit 503 shown in FIG. 5 so as to measure the sharpness degree of the image (acquired image) displayed on the "acquired image" unit 502 (step S406). In response to this, the operation unit 120 inside the system control unit 117 derives the sharpness degree of the image based upon the acquired image. The system control unit 117 determines whether or not the measured sharpness degree is included within the permissible range, and displays the measured sharpness degree and the results of determination on the "sharpness degree measuring" unit 503 (step S407). In the case when the sharpness degree is not included within the permissible range, the operator repeatedly executes the operations from step S403 to S407 until the sharpness degree has been included within the permissible range. When it is confirmed that the sharpness degree has been included in the permissible range in step S407, the operator, if necessary, stores the electron optical conditions determined in the above-mentioned steps by using a "condition storing" unit 504 shown in FIG. 5 (in FIG. 5, with a description "store conditions?") (step S408). In other words, by pressing a "Save" button down, the conditions are stored in the storage unit 119. After the electron beam adjustments from step S401 to S408 have been executed, based upon the conditions acquired in these adjustments, the operator executes a tilted observation on the sample in step S409, thereby completing the tilted observation (step S410).

Additionally, FIG. 4 shows an example in which the operator manually executes all the electron beam adjustments and the operator also executes the determination. However, the operations and determinations may be automatically executed by using a method in which, for example, based upon the sharpness degree measured by the image, a feed-back process to the control system or the like is executed. Moreover, explanations have been given on the premise that no special material is prepared as the sample 113 in the electron beam adjustments; however, a standard pattern may be preliminarily prepared as the sample 113 for use in adjustments. Moreover, the setting screen as shown in FIG. 5 is exemplary only, and it is needless to say that without being limited by this example, various modifications may be made therein.

As described above, according to the electron beam observation device 100 in accordance with the first embodiment, the deflection chromatic aberration and the deflection comma aberration that tend to cause a problem upon executing a tilted observation by using a beam tilt-system can be cancelled, with the high-order chromatic aberration being also suppressed; therefore, it becomes possible to realize a tilted observation with high resolution.

In the present embodiment, the aberration generating deflector 104 and the aberration generating lens 105 may be respectively regarded as aberration generating elements, the beam tilt-use deflector 110 may be regarded as a tilt-use deflector, and the high-order chromatic aberration controlling electromagnetic multipole 106 may be regarded as a first electromagnetic field superposing multipole. Moreover, the system control unit 116 may be regarded as being provided with a deflection aberration control unit for controlling the aberration generating element and an electromagnetic field superposing multipole control unit for controlling the first electromagnetic field superposing multipole. Furthermore, the electric field and magnetic field formed by the high-order chromatic aberration controlling electromagnetic multipole 106 serving as the first electromagnetic field superposing multipole may be regarded as the first electromagnetic field superposing field.

Second Embodiment

The first embodiment has been explained by exemplifying a configuration in which the high-order chromatic aberration controlling electromagnetic multipole 106 is used as the electromagnetic superposing dipole. The second embodiment is explained by exemplifying a configuration in which an electromagnetic field superposing quadrupole is used as the high-order chromatic aberration controlling electromagnetic multipole 106. The configuration of the electron beam observation device 100 and the cancellation of the deflection chromatic aberration and the deflection comma aberration are the same as those of the first embodiment. Moreover, the operations for executing a tilted observation are the same as those of the first embodiment. For this reason, explanations will be omitted on these points, and only the high-order chromatic aberration controlling electromagnetic multipole 106 different from that of the first embodiment will be explained.

Figure 6A:
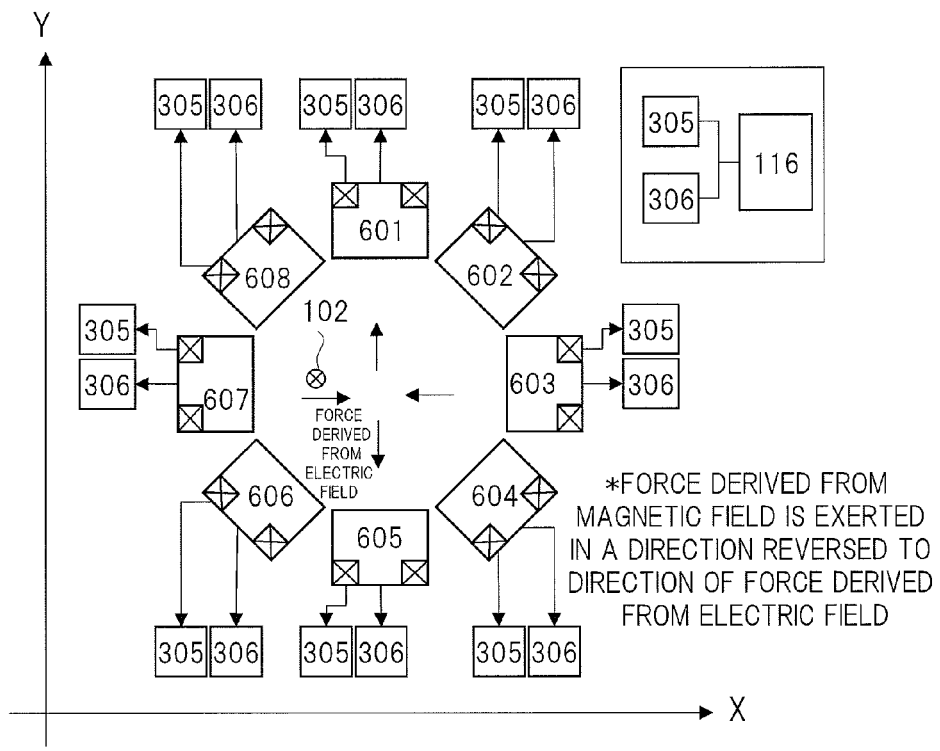
FIG. 6A is a schematic view showing a configuration of a high-order chromatic aberration controlling electromagnetic multipole in accordance with a second embodiment.
Figure 6B:
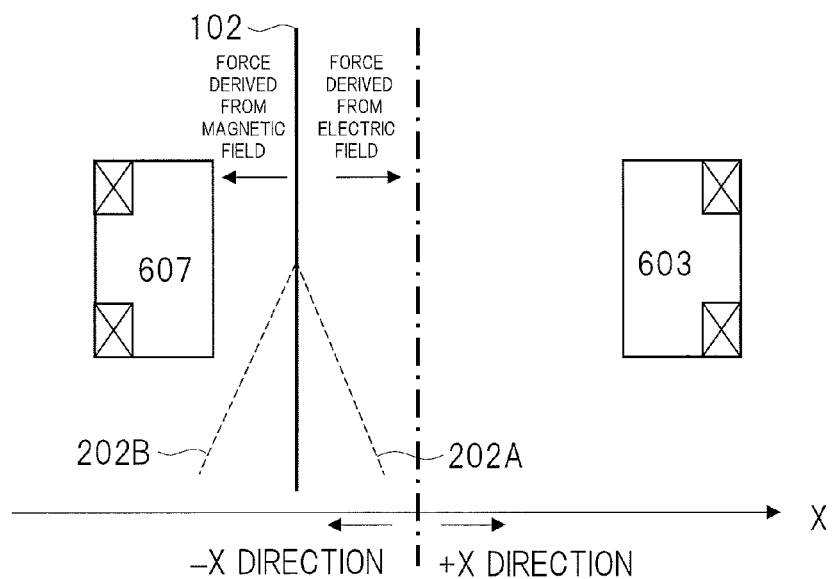
FIG. 6B is a schematic view showing a configuration of the high-order chromatic aberration controlling electromagnetic multipole in accordance with the second embodiment.

FIGS. 6A and 6B are schematic views showing a configuration of the high-order chromatic aberration controlling electromagnetic multipole 106 in accordance with the second embodiment. In the same manner as in FIGS. 3A and 3B preliminarily explained, FIG. 6A shows a plane shape of the high-order chromatic aberration controlling electromagnetic multipole 106 that is projected in a direction perpendicular to the optical axis, and FIG. 6B shows a cross-sectional shape of a cross section taken in an X direction along the optical axis.

The high-order chromatic aberration controlling electromagnetic multipole 106 in accordance with the second embodiment is provided with eight electromagnetic poles 601 to 608. Coils are wound around each of the eight electromagnetic poles 601 to 608, and each coil is connected to the optical system control circuit 116 through the corresponding current supply system 305. The optical system control circuit 116 controls the respective current supply systems 305, so that an excitation current to be supplied from each of the current supply systems 305 to the corresponding coil is controlled and a magnetic field to be generated in each of the electromagnetic poles 601 to 608 is consequently controlled. Moreover, each of the electromagnetic poles 601 to 608 is also connected to the corresponding voltage supply systems 306. In the same manner as in the current supply system 305, the voltage supply system 306 is also controlled by the optical system control circuit 116. Thus, electric fields generated by the respective electromagnetic poles 601 to 608 are also controlled by the optical system control circuit 116. Additionally, on the upper right side of FIG. 6A, a connection relation among the current supply system 305, the voltage supply system 306 and the optical system control circuit 116 is shown.

A force to be exerted on the electron beam 102 passing through the inside of the high-order chromatic aberration controlling electromagnetic multipole 106 can be indicated by a resultant force derived from forces derived from the electric field and magnetic field generated by the electromagnetic poles 601 to 608. In the second embodiment also, explanations will be given to a case where, with respect to the electron beam 102 that proceeds from the front side of the drawing paper toward the rear side thereof in FIG. 6A, a force derived from an electric field is converged in an X direction, and a dispersing force is exerted in a Y direction. Conditions in which these forces are exerted can be realized by applying positive voltages to the electromagnetic multipoles 601 and 605, as well as applying negative voltages to the electromagnetic multipoles 603 and 607. Moreover, although not shown in the figures, a force derived from a magnetic field is controlled to be cancelled by a force derived from an electric field by allowing a dispersing force to be exerted in the X direction and a converging force to be exerted in the Y direction. In this case, by allowing an electric current to flow through the coils of the electromagnetic multipoles 602, 604, 606 and 608 with a phase shift of 45 degrees from the electromagnetic multipole that generates an electric field, it becomes possible to generate a magnetic field that cancels the force derived from the electric field.

As described in the first embodiment, the force derived from the electric field exerted on the electron beam 102 is not dependent on the velocity of the electron beam 102. On the other hand, the force derived from the magnetic field is in proportion to the velocity v of the electron beam 102. That is, at the velocity $v_o$ of the main electron beam, the force derived from the electric field and the force derived from the magnetic field are cancelled with each other (eliminated), and in the case of $v>v_o$, the force derived from the magnetic field is exerted stronger, while in the case of $v<v_o$, the force derived from the electric field is exerted stronger, so that when the directions of force vectors in a state separated from the axis are aligned so as to become the same as in the electromagnetic field superposing multipole shown in the first embodiment, the same effects can be obtained. Based upon this fact, as shown in FIG. 6B, by preliminarily executing an optical axis adjustment to allow a force derived from an electric field exerted on the electron beam 102 to be exerted in a +X direction, and also to allow a force derived from a magnetic field exerted on the electron beam 102 to be exerted in a −X direction so as to be separated from the axis, it becomes possible to obtain orbit changes as indicated by FIG. 2D in the first embodiment. That is, the low speed electron beam 202A has its orbit separated from the axis on the right side in FIG. 6B, while the high speed electron beam 202B has its orbit separated from the axis on the left side in FIG. 6B; thus, the respective orbits are changed.

In the same manner as in the description of the first embodiment, also in the second embodiment, the deflection chromatic aberration and the deflection coma aberration are cancelled with each other, and by the configuration shown in FIG. 6, the high-order chromatic aberration can also be suppressed. Additionally, in the embodiment, for simplicity of explanation, explanations have been given on a quadrupolar field having a converging action in the X direction; however, the same processes can be executed even in the case when the direction of the quadrupolar field is rotated in accordance with the direction of the tilt of the electron beam. Moreover, the number of the electromagnetic multipoles forming the quadrupolar field is set to eight; however, even when the number of the electromagnetic multipoles is set to eight or more, and, for example, to twelve, the same effects can be obtained by controlling the applied voltages to the respective electromagnetic poles and the excitation currents applied to the coils so as to form the electromagnetic field superposing quadrupolar field.

In the present embodiment also, the high-order chromatic aberration controlling electromagnetic multipole 106 may be regarded as the first electromagnetic field superposing multipole, and the first electromagnetic field superposing field formed by the first electromagnetic field superposing multipole may be regarded as the quadrupolar field. When considered together with the first embodiment, the first electromagnetic field superposing field formed by the first electromagnetic field superposing multipole may be regarded as the bipolar field or the quadrupolar field.

Third Embodiment

In the first and second embodiments, explanations are given by exemplifying a configuration in which an aberration generating deflector of one stage (aberration generating deflector 104) is installed. However, the aberration generating deflectors of a plurality of stages may be installed on an optical axis. In the third embodiment, explanations will be given by exemplifying a configuration in which the aberration generating deflectors of two stages are installed as the example of the plurality of stages. In the case of the aberration generating deflector of only the one stage, in order to form an electron source image 123 on the optical axis (one dot chain line) after passing through the aberration generating lens 105, it is not possible to move the position of the electron source image 122 from the position of the aberration generating deflector, with the result that the degree of freedom in optical conditions is limited; however, by installing aberration generating deflectors of the plurality of stages, it becomes possible to increase the degree of freedom in the optical conditions. That is, in the third embodiment, the aberration generating deflectors of two stages are installed, and a hypothetical deflection fulcrum can be controlled.

Figure 7:
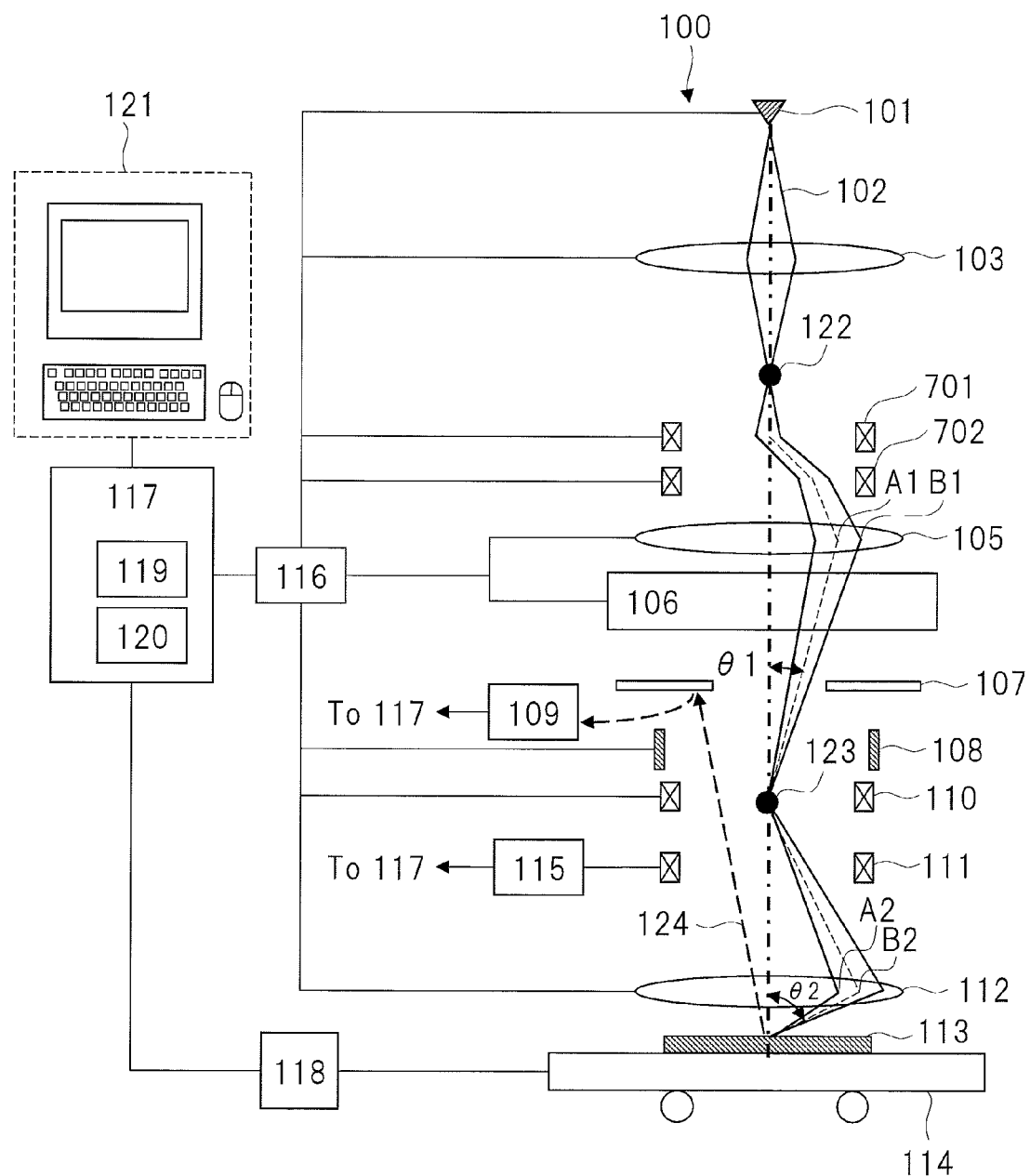
FIG. 7 is a block diagram showing a configuration of an electron beam observation device in accordance with a third embodiment.

FIG. 7 is a block diagram showing a configuration of the electron beam observation device 100 in accordance with the third embodiment. The configuration of the electron beam observation device and the operations of the tilted observation are the same as those of the above-mentioned first and second embodiments, except that in place of the aberration generating deflector 104 of the one stage, aberration generating deflectors 701 and 702 of two stages are used. For this reason, the following description will mainly discuss only the aberration generating deflectors 701 and 702 that are different from that of the first and second embodiments.

Each of the aberration generating deflectors 701 and 702 deflects the electron beam 102 in the mutually same direction or in the mutually reversed directions to change a deflection signal, so that the ratio of the deflection angles is controlled and changed. Thus, the hypothetical defection fulcrum can be changed.

In the case when the deflection angles generated by the aberration generating deflectors 701 and 702 are deflected to be $S_1$ and $S_2$ respectively, the deflection fulcrum of the general deflection generated by the two deflectors of the aberration generating deflectors 701 and 702 corresponds to a position obtained by internally dividing the distance between the aberration generating deflectors 701 and 702 by a ratio of $S_1:S_2$ when mutually deflected in the same direction. On the other hand, when deflected in mutually reversed directions, $S_1$ or $S_2$ has a negative value and a position on the upstream side of the aberration generating deflector 701 (electron source 101 side) or a position on the downstream side of the aberration generating deflector 702 (objective lens 112 side) can be selected as a hypothetical deflection fulcrum. By controlling the ratio of deflections of the aberration generating deflectors 701 and 702 in this manner, a desired hypothetical deflection fulcrum can be selected. Additionally, in the third embodiment, the number of stages of the aberration generating deflector is set to two stages of 701 and 702; however, these may be set to a desired number of a plurality of stages of two stages or more, and the same effects can be obtained.

Fourth Embodiment

In the first to third embodiments, a configuration with a beam tilt-use deflector of one stage (beam tilt-use deflector 110) has been exemplified. In the fourth embodiment, beam tilt-use deflectors of a plurality of stages are installed between the high-order chromatic aberration controlling electromagnetic multipole 106 and the objective lens 112. As described in the third embodiment, in the case when the beam tilt-use deflector of only one stage is used, even in an attempt to form a crossover on the optical axis over the sample 113 after passing through the objective lens 112, the position of the electron source image 123, that is, the position of the object side surface of the objective lens 112, cannot be moved from the position of the beam tilt-use deflector, with the result that the degree of freedom in optical conditions is limited. In the fourth embodiment, however, the beam tilt-use deflectors of two stages are prepared, so that the hypothetical deflection fulcrum becomes controllable.

Figure 8:
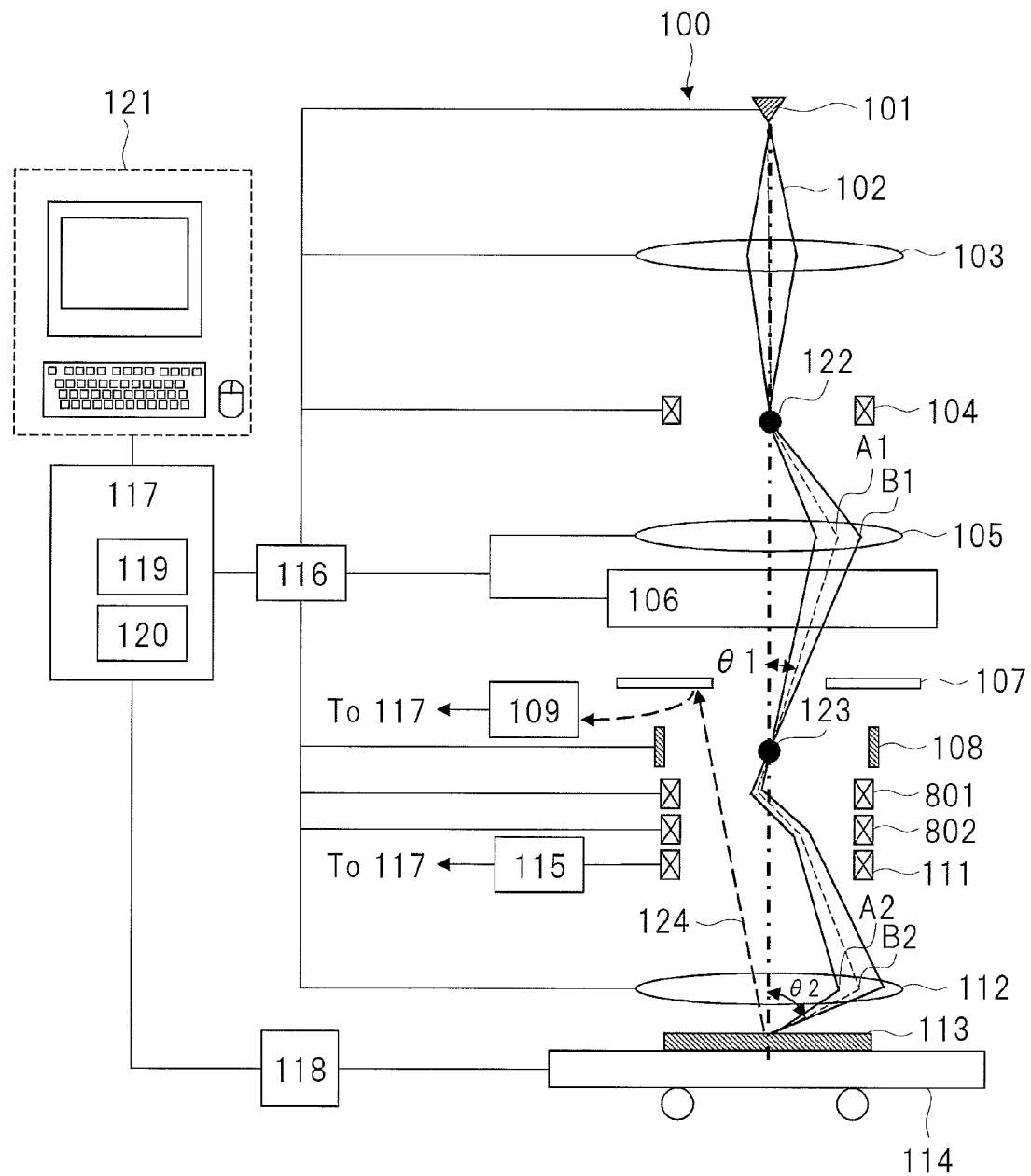
FIG. 8 is a block diagram showing a configuration of an electron beam observation device in accordance with a fourth embodiment.

FIG. 8 is a block diagram showing a configuration of the electron beam observation device 100 in accordance with the fourth embodiment. The configuration of the electron beam observation device and the operations of the tilted observation are the same as those of the above-mentioned first and second embodiments, except that in place of the beam tilt-use deflector 110 of the one stage, beam tilt-use deflectors 801 and 802 of two stages are used. For this reason, the following description will mainly discuss only the beam tilt-use deflectors 801 and 802 that are different from that of the above-mentioned first and second embodiments.

Each of the beam tilt-use deflectors 801 and 802 deflects the electron beam 102 in the mutually same direction or in the mutually reversed directions to change a deflection signal, so that the ratio of the deflection angles is controlled and changed. Thus, the hypothetical defection fulcrum can be changed. In the case when the deflection angles generated by the beam tilt-use deflectors 801 and 802 are deflected to be $S_1$ and $S_2$ respectively, the deflection fulcrum of the general deflection generated by the two deflectors of the beam tilt-use deflectors 801 and 802 corresponds to a position obtained by internally dividing the distance between the beam tilt-use deflectors 801 and 802 by a ratio of $S_1:S_2$ when mutually deflected in the same direction. On the other hand, when deflected in the mutually reversed directions, $S_1$ or $S_2$ has a negative value and a position on the upstream side of the beam tilt-use deflector 801 (electron source 101 side) or a position on the downstream side of the beam tilt-use deflector 802 (objective lens 112 side) can be selected as a hypothetical deflection fulcrum.

In this manner, by controlling the ratio of deflections of the beam tilt-use deflectors 801 and 802, a desired hypothetical deflection fulcrum can be selected. Additionally, in the present embodiment, the number of stages of the beam tilt-use deflector is set to two stages of 801 and 802; however, these may be set to a desired number of a plurality of stages of two stages or more, and the same effects can be obtained.

Fifth Embodiment

In the first to fourth embodiments, a configuration with a high-order chromatic aberration controlling electromagnetic multipole of one stage (high-order chromatic aberration controlling electromagnetic multipole 106) has been exemplified. In the case of the high-order chromatic aberration controlling electromagnetic multipole of one stage, it is possible to simplify the configuration of the electron optical system and the control thereof. However, as described in the first embodiment, since strictly speaking, the orbits of the electron beams having different energies deflected by the high-order chromatic aberration controlling electromagnetic multipole 106 are not coincident with the orbits at the time of the deflection chromatic aberration correction shown in FIG. 2B; therefore, the amount of the deflected chromatic aberration generated by the aberration generating deflector is slightly fluctuated. In the fifth embodiment, in order to solve this problem, the high-order chromatic aberration controlling electromagnetic multipoles of a plurality of stages are installed. Here, explanations will be given by exemplifying a configuration in which high-order chromatic aberration controlling electromagnetic multipoles 901 and 902 of two stages are installed along the optical axis.

Figure 9:
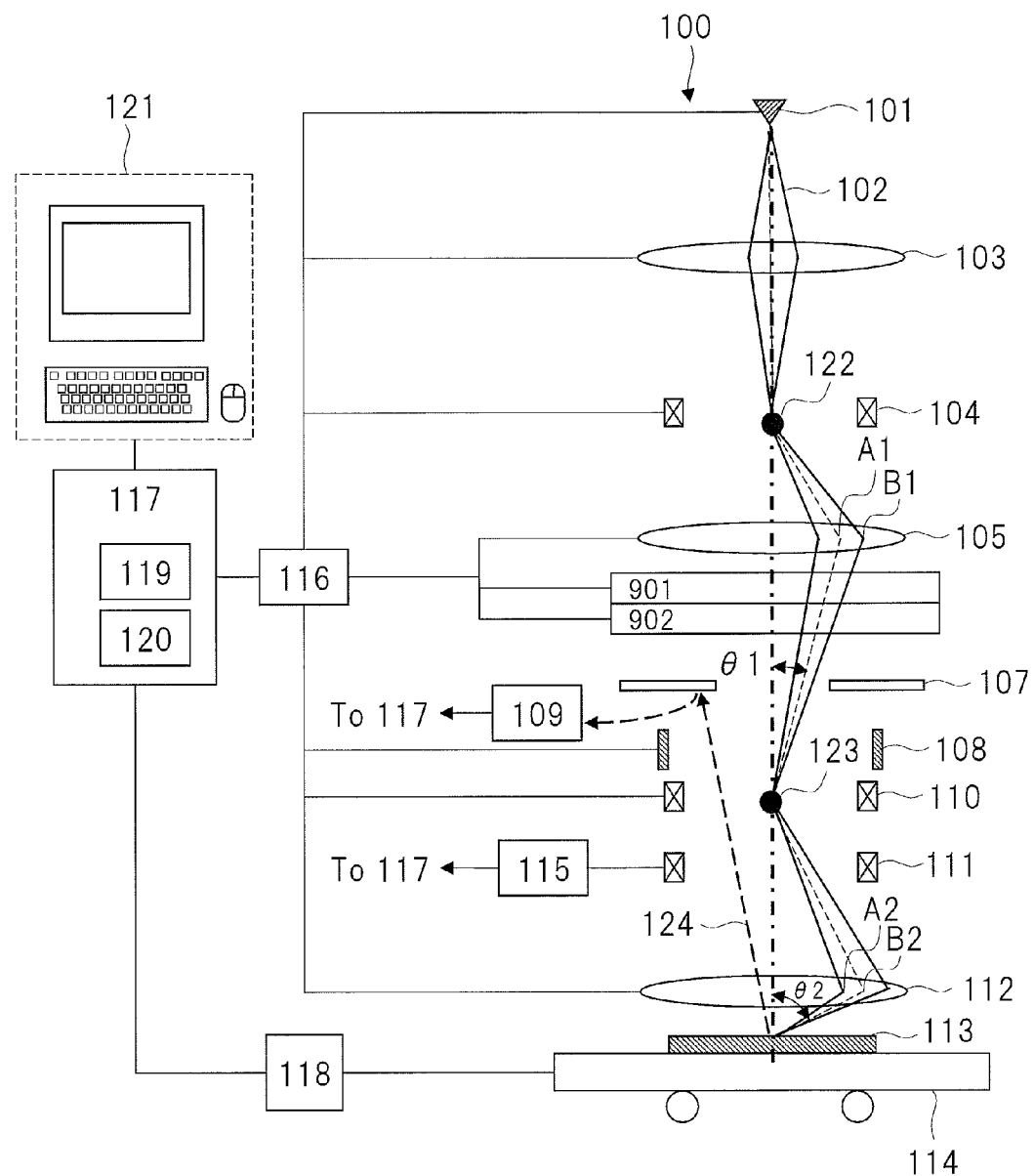
FIG. 9 is a block diagram showing a configuration of an electron beam observation device in accordance with a fifth embodiment.
Figure 10:
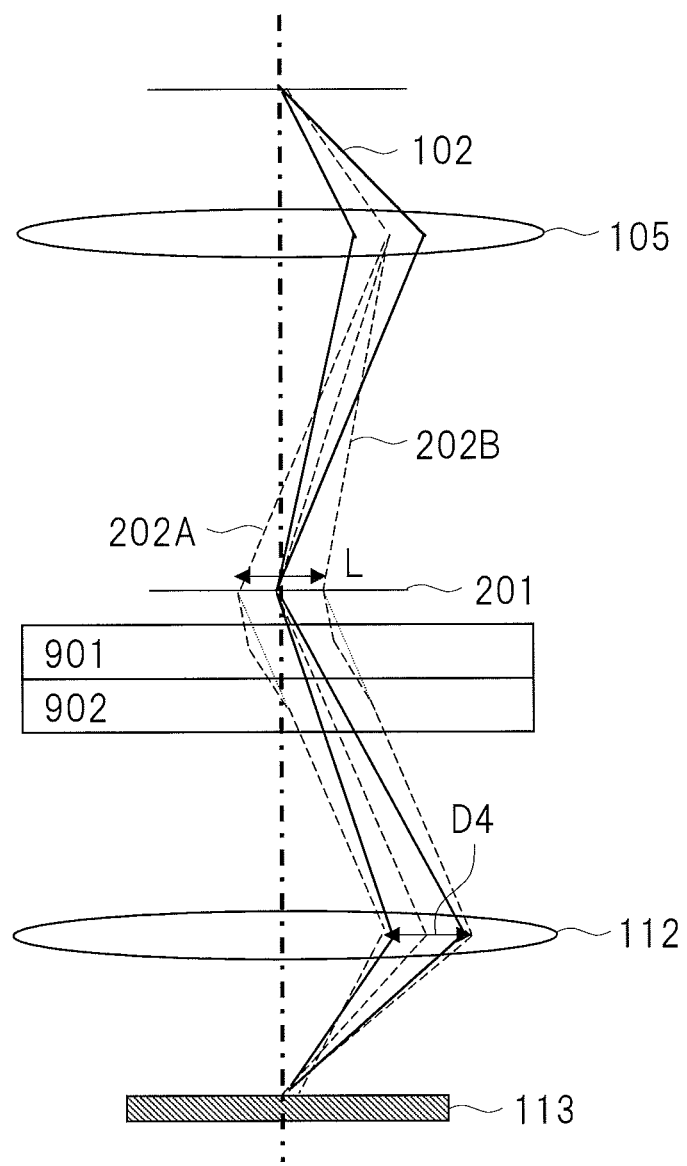
FIG. 10 is a schematic view showing a configuration of a beam-tilt electron optical system in accordance with the fifth embodiment.

FIG. 9 is a block diagram showing a configuration of the electron beam observation device 100 in accordance with the fifth embodiment. The configuration of the electron beam observation device and the operations of the tilted observation are the same as those of the above-mentioned first and fourth embodiments, except that in place of the high-order chromatic aberration controlling electromagnetic multipole 106 of one stage, high-order chromatic aberration controlling electromagnetic multipoles 901 and 902 (first electromagnetic field superposing multipole and second electromagnetic field superposing multipole) of two stages are used. For this reason, the following description will mainly discuss only the high-order chromatic aberration controlling electromagnetic multipoles 901 and 902, which are different from those of the above-mentioned first to fourth embodiments. Moreover, FIG. 10 is a schematic view showing a configuration of a beam-tilt optical system in accordance with the present embodiment. In the same manner as in FIGS. 2A to 2D, FIG. 10 shows only the portions in accordance with the explanations. That is, among the elements included in the electron optical system, those elements except for the aberration generating lens 105, the objective lens 112 and the high-order chromatic aberration controlling electromagnetic multipoles 901 and 902 are omitted. In FIG. 2D, the beam-tilt optical system which uses the high-order chromatic aberration controlling electromagnetic multipole 106 of the first stage has been schematically shown. In contrast, in FIG. 10, a beam-tilt optical system which uses high-order chromatic aberration controlling electromagnetic multipoles 901 and 902 of two stages is schematically shown.

Next, referring to FIGS. 2, 9 and 10, the following description will explain points different from the first to fourth embodiments. As has been already described in the first embodiment, strictly speaking, the orbits of the electron beams having different energies shown in FIG. 2D are not coincident with orbits at the time of the deflection chromatic aberration correction shown in FIG. 2B. This is because the fulcrum of a change in the orbit caused by the high-order chromatic aberration controlling multipole 106 is not coincident with the object side surface 201 of the objective lens 112.

By using the high-order chromatic aberration controlling electromagnetic multipoles 901 and 902 of two stages as the high-order chromatic aberration controlling electromagnetic multipole, as well as by allowing the directions in which the electromagnetic field superposing fields, formed by each of the high-order chromatic controlling electromagnetic multipoles 901 and 902, are exerted, that is, the directions of deflections, to be directed in the mutually same direction or in the mutually reversed directions, with the respective intensities of the deflections being changed, so that the ratio of intensities are controlled and changed. At this time, in the same manner as in the example shown in the first to fourth embodiments, each of the high-order chromatic aberration controlling electromagnetic multipoles 901 and 902 is controlled such that forces derived from the electric field and the magnetic field are cancelled with each other so as not to change the orbit of the main electron beam. By preparing the high-order chromatic aberration controlling electromagnetic multipoles 901 and 902 of two stages, it becomes possible to simultaneously control two parameters, and consequently to control a difference D4 between positions of the electron beams 202A and 202B having different energies within the objective lens 112, so as to be coincident with the difference D1 of the position shown in FIG. 2B. Moreover, when the orbits of the electron beams 202A and 202B are externally inserted (indicated by thin broken lines) onto the object side surface 201, it becomes possible to control the position externally inserted on the object side surface 201, so as to be coincident with a position at the time when no high-order chromatic aberration controlling electromagnetic multipole is used.

As described above, by preparing the high-order chromatic aberration controlling electromagnetic multipoles 901 and 902 of two stages, it becomes possible to suppress the high-order chromatic aberration without causing fluctuations in the deflection chromatic aberration amount generated by the aberration generating deflector. Additionally, in the present embodiment, the number of stages of the high-order chromatic aberration controlling electromagnetic multipole is set to two stages of 901 and 902; however, these may be set to a desired number of a plurality of stages of two stages or more, and the same effects can be obtained.

In the first to fifth embodiments, the high-order chromatic aberration is suppressed by the high-order chromatic aberration controlling electromagnetic multipole disposed between the detection-use reflection plate 107 and the aberration generating lens 105. For this reason, since no lens for suppressing the high-order chromatic aberration need to be disposed at a crossover position where many detection-system devices are disposed, it becomes possible to increase the degree of freedom at the crossover position.

In the foregoing, the invention made by the inventors of the present invention has been concretely described based on the embodiments. However, it is needless to say that the present invention is not limited to the foregoing embodiments and various modifications and alterations can be made within the scope of the present invention. Of course, a plurality of embodiments may be combined with one another.

What is claimed is:

1. A charged particle beam application device for converging a charged particle beam generated by a charged particle source on a sample by using an objective lens, the device comprising:
    an aberration generating element installed between the charged particle beam source and the objective lens;
    a tilt-use deflector installed between the aberration generating element and the objective lens;
    a deflection aberration control unit for controlling the aberration generating element;
    a first electromagnetic field superposing multipole installed between the aberration generating element and the objective lens; and
    an electromagnetic field superposing multipole control unit for controlling the first electromagnetic field superposing multipole,
    wherein the first electromagnetic field superposing multipole is controlled to deflect respective orbits of a low speed electron beam and a high speed electron beam such that a controlled distance between said orbits within the objective lens is less than an uncontrolled distance between said orbits within the objective lens, thereby controlling a high-order chromatic aberration, and
    wherein the first electromagnetic field superposing multipole is controlled to cause no orbit change in a main electron beam, the main electron beam being disposed between the low speed electron beam and the high speed electron, and wherein the first electromagnetic field superposing multipole is controlled to cause the low speed electron beam and the high speed electron beam to maintain a substantially constant distance with respect to each other until reaching the objective lens.

2. The charged particle beam application device according to claim 1,
    wherein when the charged particle beam is made incident on the objective lens, the deflection aberration control unit controls the aberration generating element so as to cancel a deflection chromatic aberration or a deflection comma aberration that is determined by a position in the objective lens.

3. The charged particle beam application device according to claim 1,
    wherein the electromagnetic field superposing multipole control unit controls the first electromagnetic field superposing multipole so as to allow the first electromagnetic field superposing multipole to form a first electromagnetic field superposing field for canceling a change in an orbit of a main charged particle beam in the charged particle beam.

4. The charged particle beam application device according to claim 3, wherein the first electromagnetic field superposing field is a bipolar field or a quadrupolar field.

5. The charged particle beam application device according to claim 1,
wherein the aberration generating element is further provided with a lens of at least one stage and a deflector of at least one stage, both of which are installed on an optical axis of the charged particle beam.

6. The charged particle beam application device according to claim 1,
wherein the tilt-use deflector is further provided with deflectors of at least two stages respectively installed on an optical axis of the charged particle beam.

7. The charged particle beam application device according to claim 1, further comprising:
a second electromagnetic field superposing multipole that is installed between the aberration generating element and the objective lens, and controlled by the electromagnetic field superposing multipole control unit.

8. The charged particle beam application device according to claim 7,
wherein the electromagnetic field superposing multipole control unit controls the first electromagnetic field superposing multipole and the second electromagnetic field superposing multipole so as to allow the first electromagnetic field superposing multipole and the second electromagnetic field superposing multipole to form the first electromagnetic field superposing field and second electromagnetic field superposing field for canceling a change in an orbit of a main charged particle beam in the charged particle beam, and
the electromagnetic field superposing multipole control unit controls the first electromagnetic field superposing multipole and the second electromagnetic field superposing multipole such that a direction in which the first electromagnetic field superposing field is exerted and a direction in which the second electromagnetic field superposing field is exerted are set in a same direction or reversed directions, relative to charged particle beams having energies different from energy of the main charged particle beam.

9. The charged particle beam application device according to claim 8,
wherein each of the first electromagnetic field superposing field and the second electromagnetic field superposing field is a bipolar field or a quadrupolar field.

* * * * *